United States Patent
Lake

(10) Patent No.: US 7,863,727 B2
(45) Date of Patent: Jan. 4, 2011

(54) MICROELECTRONIC DEVICES AND METHODS FOR MANUFACTURING MICROELECTRONIC DEVICES

(75) Inventor: Rick C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 850 days.

(21) Appl. No.: 11/347,863

(22) Filed: Feb. 6, 2006

(65) Prior Publication Data

US 2007/0181992 A1 Aug. 9, 2007

(51) Int. Cl.
*H01L 23/04* (2006.01)
(52) U.S. Cl. ............... 257/698; 257/787; 257/E23.011
(58) Field of Classification Search ................. 257/686, 257/698, 787, E25.011
See application file for complete search history.

(56) References Cited

U.S. PATENT DOCUMENTS

| 5,953,814 | A  | * | 9/1999  | Sozansky et al. ............ 29/840 |
| 6,472,758 | B1 |   | 10/2002 | Glenn et al. |
| 6,677,677 | B2 | * | 1/2004  | Kimura et al. ............ 257/737 |
| 7,118,940 | B1 | * | 10/2006 | Myers et al. ............ 438/108 |
| 7,445,141 | B2 | * | 11/2008 | Daves et al. ........... 228/180.22 |
| 2002/0041036 | A1 | * | 4/2002  | Smith ..................... 257/778 |
| 2002/0146861 | A1 | * | 10/2002 | Standing ................. 438/108 |
| 2005/0028361 | A1 | * | 2/2005  | Yin et al. .................. 29/841 |
| 2005/0140028 | A1 | * | 6/2005  | Venkateswaran ........... 257/782 |

OTHER PUBLICATIONS

Dow Corning Corporation, Electronics Solutions, Specialty Materials, 2 pages, retrieved from the Internet on Jan. 3, 2006, <http://www.dowcorning.com/content/etronics/etronicswet/newtim_tutorial_10.asp?DCWS=...>.
Electronicstalk, "Adhesive conducts 40% more heat," 4 pages, retrieved from the Internet on Jan. 3, 2006, <http://www.electronicstalk.com/news/hen/hen145.html>.

* cited by examiner

*Primary Examiner*—Evan Pert
*Assistant Examiner*—Krista Soderholm
(74) *Attorney, Agent, or Firm*—Perkins Coie LLP

(57) ABSTRACT

Microelectronic devices and methods for manufacturing microelectronic devices are disclosed herein. In one embodiment, a microelectronic device includes a microelectronic die, a plurality of electrical couplers projecting from the die, and a flowable material disposed on the die. The die includes an integrated circuit and a plurality of terminals operably coupled to the integrated circuit. The electrical couplers are attached to corresponding terminals on the die. The flowable material includes a plurality of spacer elements sized to space the die apart from another component. The flowable material may be a no-flow underfill, a flux compound, or other suitable material.

20 Claims, 9 Drawing Sheets

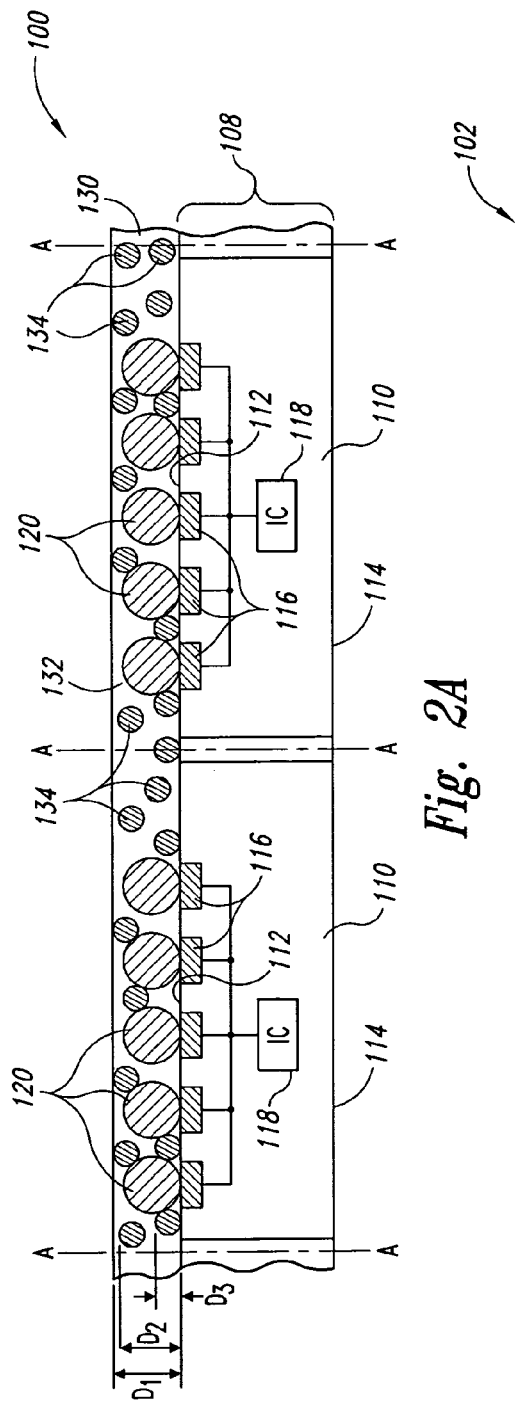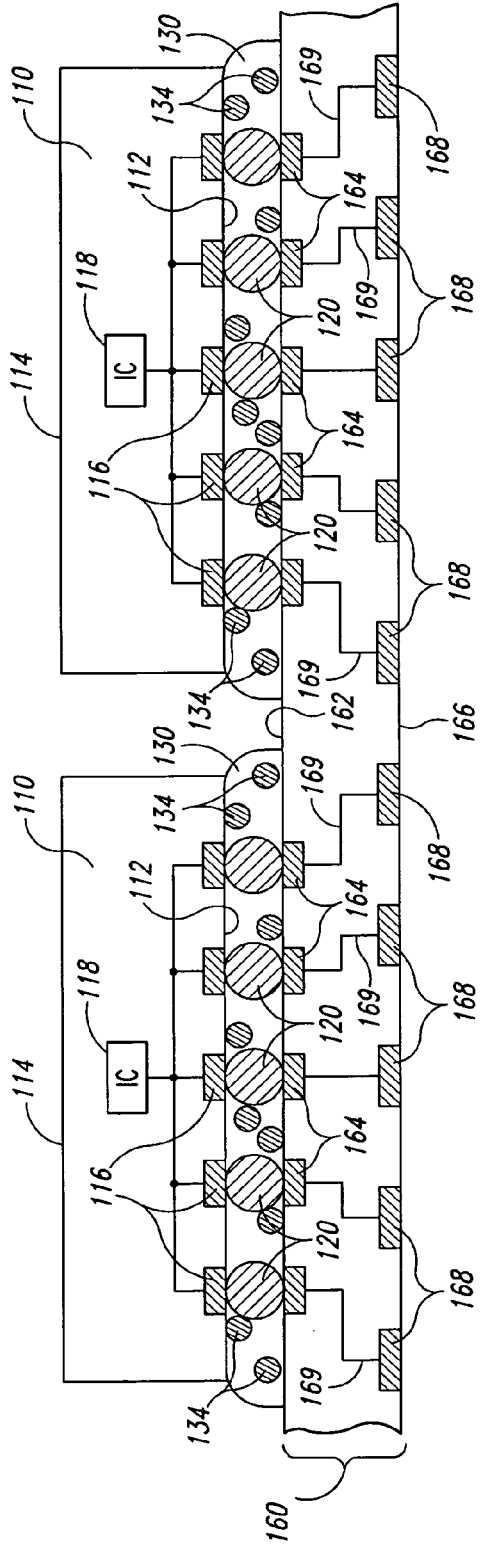

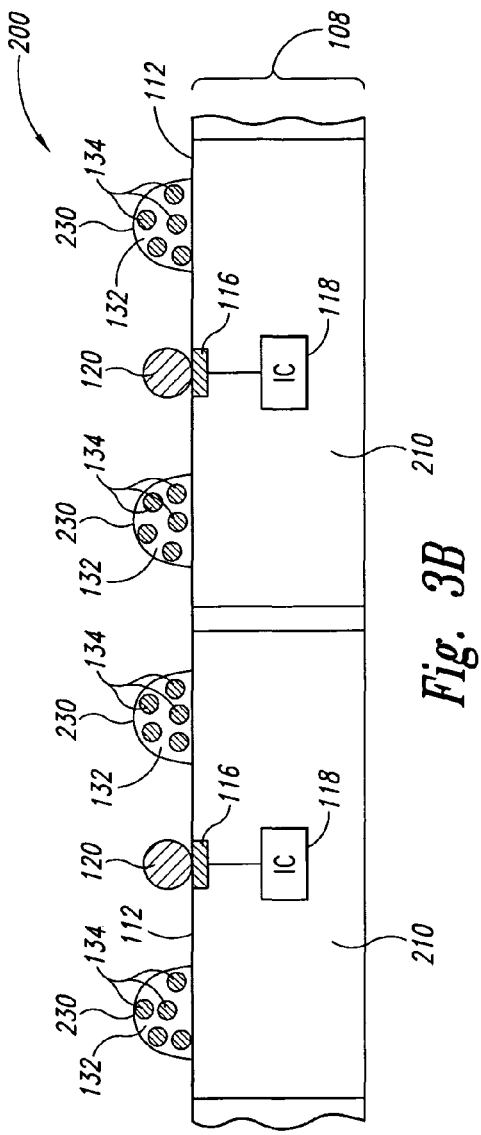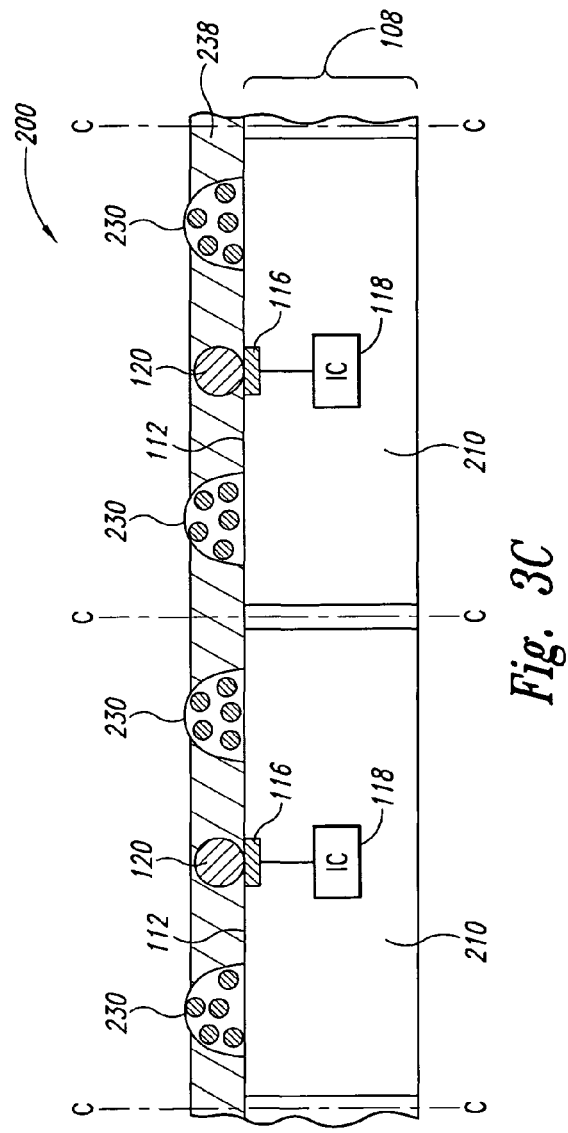

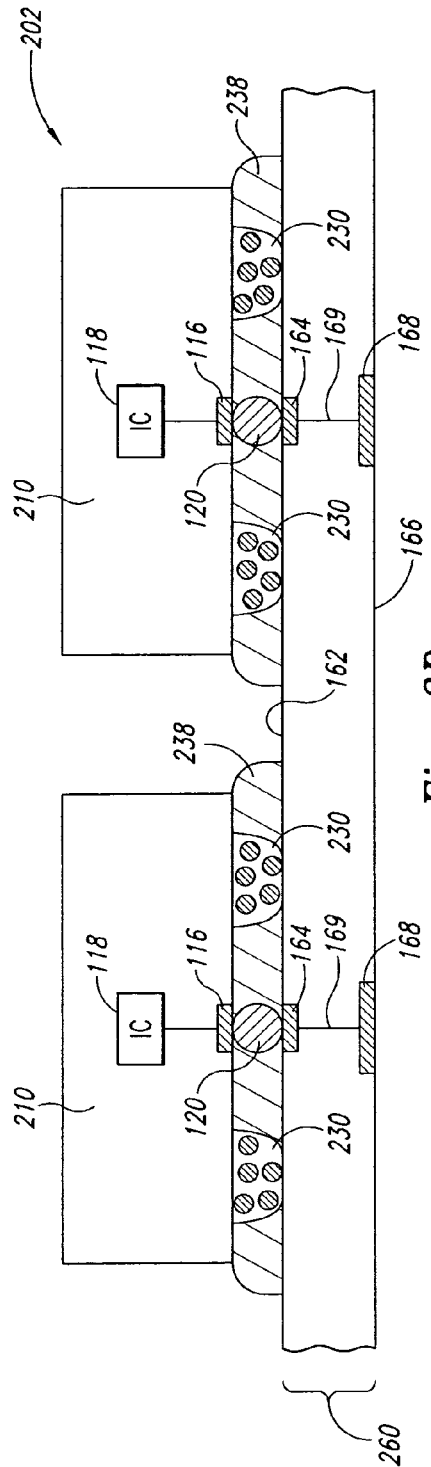
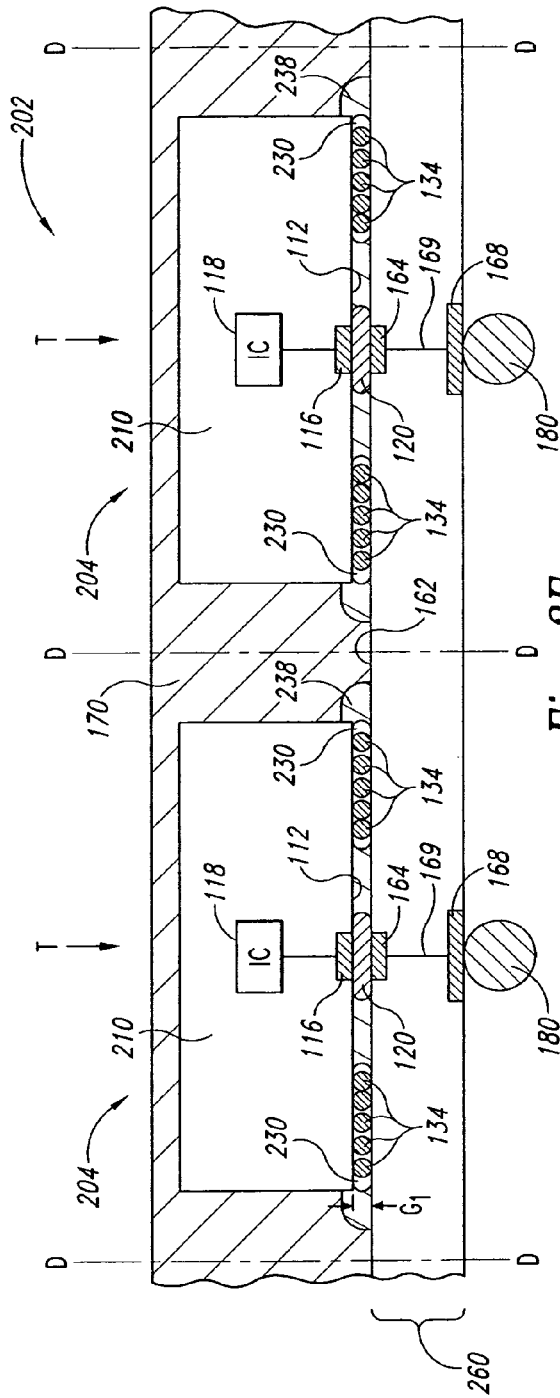
Fig. 3D
Fig. 3E

MICROELECTRONIC DEVICES AND METHODS FOR MANUFACTURING MICROELECTRONIC DEVICES

TECHNICAL FIELD

The present invention is related to microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines, and ground lines.

One type of microelectronic device is a "flip-chip" semiconductor device. These devices are referred to as "flip-chips" because they are typically manufactured on a wafer and have an active side with bond-pads that initially face upward. After manufacture is completed and a die is singulated, the die is inverted or "flipped" such that the active side bearing the bond-pads faces downward for attachment to a substrate. The bond-pads are usually coupled to terminals, such as conductive "bumps," that electrically and mechanically connect the die to the substrate. The bumps on the flip-chip can be formed from solders, conductive polymers, or other materials. In applications using solder bumps, the solder bumps are reflowed to form a solder joint between the flip-chip component and the substrate. This leaves a small gap between the flip-chip and the substrate. To enhance the integrity of the joint between the die and the substrate, an underfill material is introduced into the gap. The underfill material bears some of the stress placed on the components and protects the components from moisture, chemicals, and other contaminants. The underfill material can include filler particles to increase the rigidity of the material and modify the coefficient of thermal expansion of the material.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the surface area or "footprint" of a microelectronic device on a printed circuit board. Reducing the size of a microelectronic device is difficult because high performance microelectronic dies generally have more bond-pads, which result in larger ball-grid arrays and thus larger footprints. One technique used to increase the density of microelectronic dies within a given footprint is to stack one microelectronic die on top of another. For example, FIG. 1A schematically illustrates a conventional microelectronic device 4 including a first microelectronic die 10a, a second microelectronic die 10b stacked on top of the first die 10a, an interposer substrate 60 carrying the first and second dies 10a-b, a plurality of first solder bumps 20a between the first die 10a and the substrate 60, and a plurality of second solder bumps 20b (only one shown) between the first and second dies 10a-b. FIG. 1B schematically illustrates the microelectronic device 4 after reflowing the first and second solder bumps 20a-b to mechanically and electrically connect the first die 10a to the substrate 60 and the second die 10b to the first die 10a, respectively.

One drawback of the conventional microelectronic device 4 illustrated in FIGS. 1A and 1B is that during reflow the weight of the dies 10a-b may cause the heated solder bumps 20a-b to collapse such that the dies 10a-b move toward the substrate 60 in a direction X. The collapse of the solder bumps 20a-b and associated movement of the dies 10a-b can cause several problems. First, the solder from the bumps 20a-b may spread too far such that the solder from one bump 20a-b contacts the solder from an adjacent bump 20a-b and creates an electrical short in the device 4. Second, the downward movement of the dies 10a-b may leave an insufficient gap Y between the first die 10a and the substrate 60 and/or between the first and second dies 10a-b. If the gap Y between the components is too small, it is difficult to wick underfill material into the gap Y. Third, the downward movement of the dies 10a-b creates variances in the height of different devices 4, which can cause problems with molding, testing, and other post-reflow processes that require known device heights. Fourth, when the solder bumps 20b are positioned along only a central portion of the die 10b (e.g., memory dies), the second die 10b may tilt after reflow. Die tilt can also cause problems with molding, testing, and other post-reflow processes. For example, if the second die 10b is not parallel to the first die 10a, the "high side" of the second die 10b may be exposed after encapsulation. Accordingly, there is a need to improve the process of packaging dies in microelectronic devices.

BRIEF DESCRIPTION OF THE DRAWINGS

FIGS. 2A-2C illustrate stages in one embodiment of a method for manufacturing a plurality of microelectronic devices in accordance with the invention.

FIG. 2A is a schematic side cross-sectional view of a portion of a microfeature workpiece including a substrate and a plurality of microelectronic dies formed in and/or on the substrate.

FIG. 2B is a schematic side cross-sectional view of a microelectronic device assembly including a plurality of singulated dies arranged in an array on a support member.

FIG. 2C is a schematic side cross-sectional view of the microelectronic device assembly after reflowing the electrical couplers to mechanically and electrically connect the terminals to the contacts.

FIGS. 3A-3E illustrate stages in another embodiment of a method for manufacturing a plurality of microelectronic devices in accordance with the invention.

FIG. 3A is a top plan view of a microfeature workpiece.

FIG. 3B is a schematic side cross-sectional view of the workpiece taken substantially along line 3B-3B in FIG. 3A.

FIG. 3C is a schematic side cross-sectional view of the workpiece after forming an underfill layer on the dies.

FIG. 3D is a schematic side cross-sectional view of a microelectronic device assembly including a plurality of singulated microelectronic dies arranged in an array on a support member.

FIG. 3E is a schematic side cross-sectional view of the microelectronic device assembly after reflowing the electrical couplers to mechanically and electrically connect the terminals to the contacts.

FIG. 5A is a schematic side cross-sectional view of a microelectronic device assembly in accordance with another embodiment of the invention.

FIG. 5B is a schematic side cross-sectional view of the microelectronic device assembly after reflowing the first and second electrical couplers.

DETAILED DESCRIPTION

A. Overview

Figure 1A:
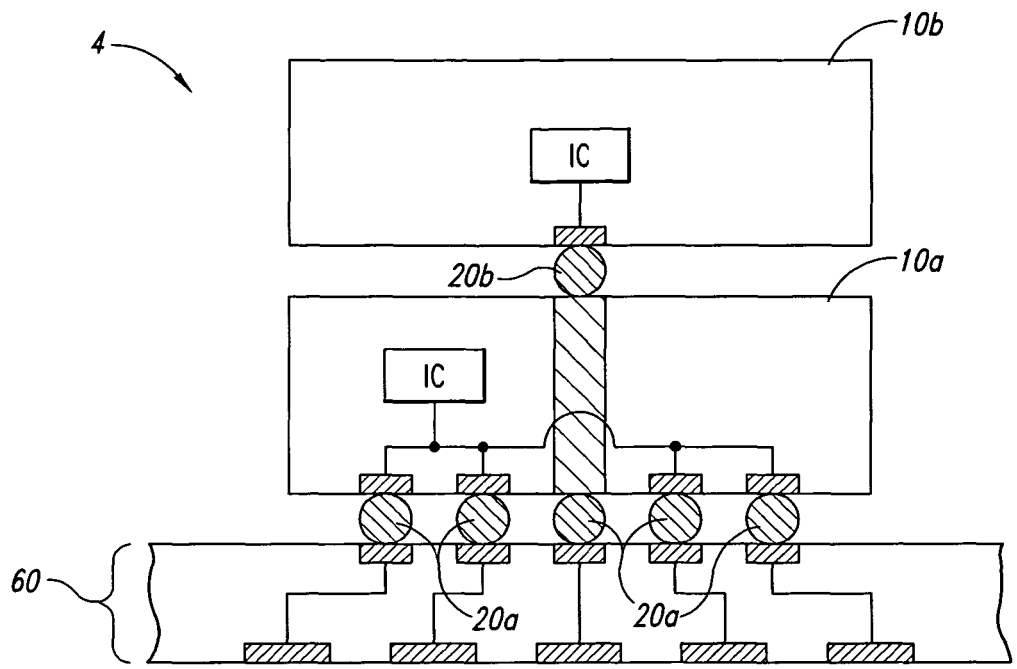
FIG. 1A schematically illustrates a conventional microelectronic device in accordance with the prior art.
Figure 1B:
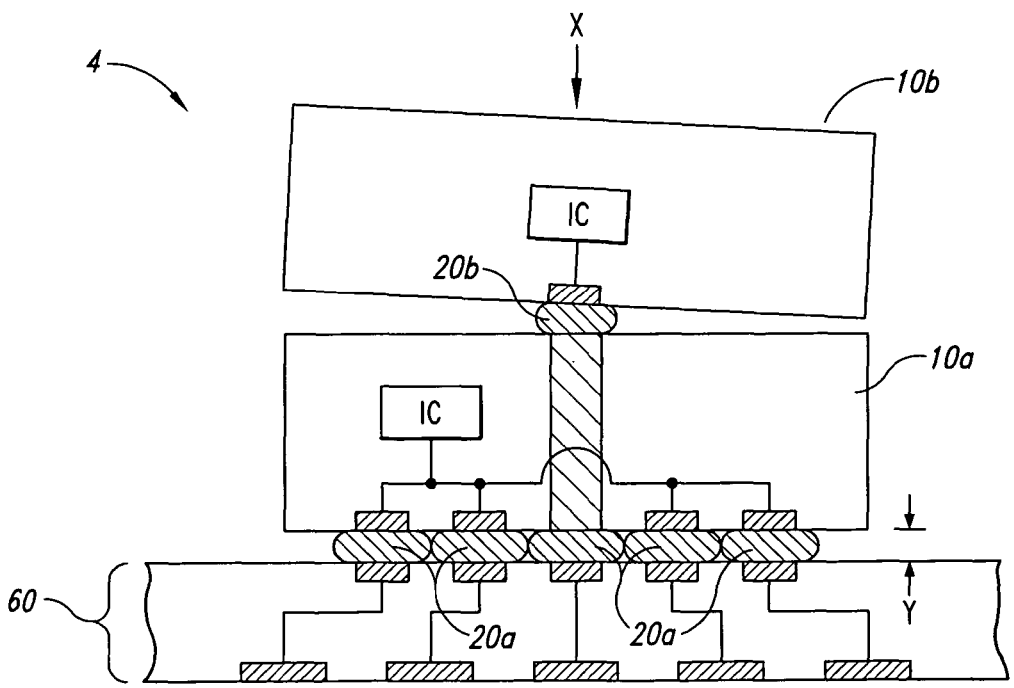
FIG. 1B schematically illustrates the conventional microelectronic device of FIG. 1A after reflowing the solder bumps.

The following disclosure describes several embodiments of microelectronic devices and methods for manufacturing microelectronic devices. An embodiment of one such device includes a microelectronic die, a plurality of electrical couplers projecting from the die, and a flowable material disposed on the die. The die includes an integrated circuit and a plurality of terminals operably coupled to the integrated circuit. The electrical couplers are attached to corresponding terminals on the die. The flowable material includes a plurality of spacer elements sized to space the die apart from another component to which the die is subsequently attached. The flowable material may be a no-flow underfill, a flux compound, or other suitable material.

In another embodiment, a microelectronic device includes (a) a microelectronic component having an active side and a plurality of terminals on the active side, (b) a plurality of electrical couplers attached to corresponding terminals and projecting from the microelectronic component, and (c) a flowable material disposed on the active side of the microelectronic component. The individual electrical couplers have a first dimension, and the flowable material includes a plurality of spacer elements having a second dimension at least 30% of the first dimension.

In another embodiment, a microelectronic device includes (a) a microelectronic component having a plurality of terminals, (b) a plurality of electrical couplers attached to corresponding terminals, (c) a substrate having a plurality of contacts coupled to corresponding electrical couplers, and (d) a flowable material between the microelectronic component and the substrate. The flowable material includes a plurality of spacer elements with at least one spacer element contacting the microelectronic component and the substrate. The electrical couplers can include a plurality of reflowed solder balls.

In another embodiment, a microelectronic device includes a first microelectronic die, a second microelectronic die, and a plurality of electrical couplers between the first and second dies. The first die includes an integrated circuit, a plurality of terminals operably coupled to the integrated circuit, and a plurality of conductive interconnects extending through the first die. The second die includes an integrated circuit and a plurality of terminals operably coupled to the integrated circuit. The electrical couplers electrically connect the terminals of the second die to corresponding interconnects of the first die. The microelectronic device further includes a flowable material disposed between the first and second dies. The flowable material includes a plurality of spacer elements sized to space the first and second dies apart by a gap.

Another aspect of the invention is directed to methods for manufacturing microelectronic devices. An embodiment of one such method includes depositing a flowable material onto a first microelectronic component having a plurality of terminals, and attaching the first microelectronic component to a second microelectronic component with the flowable material positioned between the first and second components and with a plurality of electrical couplers electrically connecting the terminals on the first component to corresponding contacts on the second component. The flowable material includes a plurality of spacer elements. The method further includes reflowing the electrical couplers such that at least one of the spacer elements contacts the first and second microelectronic components.

Specific details of several embodiments of the invention are described below with reference to microelectronic devices with two stacked microelectronic dies, but in other embodiments the microelectronic devices can have a different number of stacked dies. Several details describing well-known structures or processes often associated with fabricating microelectronic dies and microelectronic devices are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2A-5B.

The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Manufacturing Microelectronic Devices

Figure 2C:
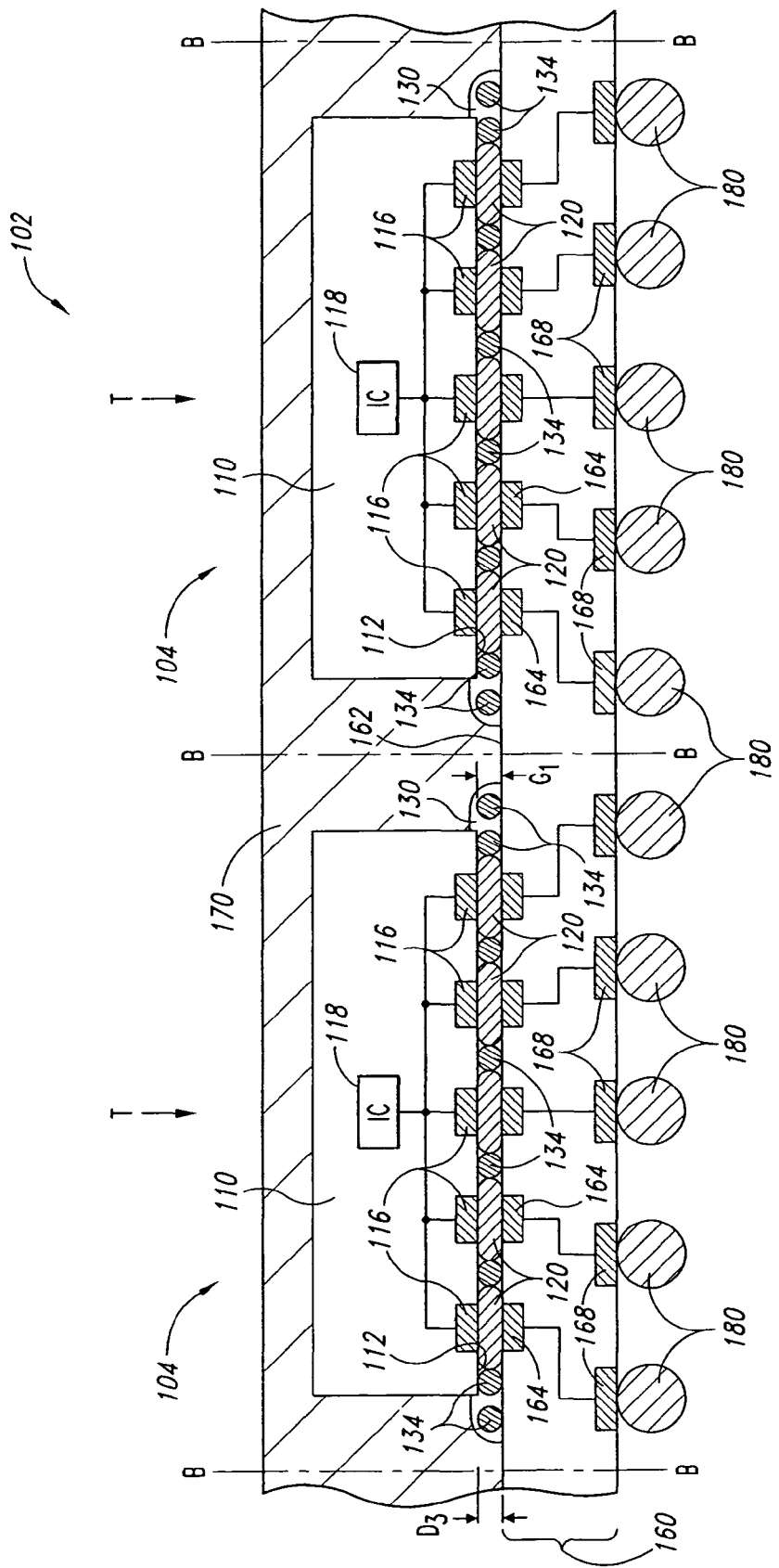

FIGS. 2A-2C illustrate stages in one embodiment of a method for manufacturing a plurality of microelectronic devices in accordance with the invention. For example, FIG. 2A is a schematic side cross-sectional view of a portion of a microfeature workpiece 100 including a substrate 108 and a plurality of microelectronic dies 110 (only two are shown) formed in and/or on the substrate 108. The individual dies 110 include an active side 112, a backside 114 opposite the active side 112, a plurality of terminals 116 (e.g., bond-pads) arranged in an array on the active side 112, and an integrated circuit 118 (shown schematically) operably coupled to the terminals 116. Although the illustrated dies 110 have the same structure, in other embodiments the dies may have different features to perform different functions.

After manufacturing the microelectronic dies 110, a plurality of electrical couplers 120 are constructed on corresponding terminals 116 and a flowable material or underfill layer 130 is formed across the workpiece 100. The electrical couplers 120 project from the dies 110 and are conductive structures for electrically coupling the individual dies 110 to other components, such as printed circuit boards or other dies. For example, the illustrated electrical couplers 120 can be solder balls that are "bumped" onto the dies 110 using a capillary or another suitable device. The underfill layer 130 protects the active side 112 of the dies 110 from moisture, chemicals, or other contaminants. The underfill layer 130 can be formed on the workpiece 100 by spin-on processes or other suitable processes. In the illustrated embodiment the underfill layer 130 has a thickness $D_1$ greater than a diameter $D_2$ of the electrical couplers 120, but in other embodiments the thickness $D_1$ of the underfill layer 130 can be less than the diameter $D_2$ of the electrical couplers 120.

The illustrated underfill layer 130 includes a flowable matrix or binder 132 and a plurality of spacer elements 134 disposed within the binder 132. The binder 132 can include a no-flow underfill, an epoxy flux, a tacky flux, or other material. For example, suitable binders 132 include FluxFill™ FF-2300 manufactured by Henkel Technologies of Irvine, Calif., and PK-002 Flip-Chip Epoxy Flux manufactured by Indium Corporation of Utica, N.Y.

The spacer elements 134 are sized to provide a minimum gap between the individual dies 110 and the corresponding external members. For example, in several applications, the spacer elements 134 may have a diameter $D_3$ between approximately 37 μm and approximately 100 μm. In other applications, however, the diameter $D_3$ of the spacer elements 134 can be less than 37 μm or greater than 100 μm. The size of the spacer elements 134 may also be based on the size of the electrical couplers 120. For example, the diameter $D_3$ of the spacer elements 134 can be between approximately 30% and approximately 99% (e.g., 40%-70% and 50%-60%) of the diameter $D_2$ of the electrical couplers 120. In one such embodiment, the diameter $D_2$ of the electrical couplers 120 is approximately 80 μm, and the diameter $D_3$ of the spacer elements 134 is between approximately 37 μm and approximately 50 μm. In other embodiments, the diameter $D_3$ of the spacer elements 134 can be less than 37 μm or greater than 50 μm. In either case, the diameter $D_3$ of the spacer elements 134 is less than the diameter $D_2$ of the electrical couplers 120 so that the electrical couplers 120 can contact corresponding pads on the external member. The spacer elements 134 can be glass spheres or other dielectric members that do not interfere with the electrical connection between the electrical couplers 120 and the external member. After forming the underfill layer 130, the workpiece 100 can be heated to at least partially cure (e.g., B stage) the underfill layer 130, and the workpiece 100 can be cut along lines A-A to singulate the individual microelectronic dies 110.

FIG. 2B is a schematic side cross-sectional view of a microelectronic device assembly 102 including the singulated dies 110 arranged in an array on a support member 160. The support member 160 can be a lead frame or a substrate, such as a printed circuit board, for carrying the dies 110. The illustrated support member 160 includes a first side 162 with a plurality of contacts 164 and a second side 166 with a plurality of pads 168. The contacts 164 are arranged in arrays for electrical coupling to corresponding electrical couplers 120. The pads 168 are arranged in arrays to receive a plurality of conductive members (e.g., solder balls). The support member 160 further includes a plurality of conductive traces 169 electrically coupling the contacts 164 to corresponding pads 168. The microelectronic dies 110 are placed on the support member 160 by pressing the underfill layer 130 against the first side 162 of the support member 160 with the electrical couplers 120 aligned with corresponding contacts 164.

FIG. 2C is a schematic side cross-sectional view of the microelectronic device assembly 102 after reflowing the electrical couplers 120 to mechanically and electrically connect the terminals 116 to the contacts 164. During reflow, the weight of the dies 110 can cause the heated electrical couplers 120 to collapse such that the dies 110 move toward the support member 160 in a direction T. Although the movement of the dies 110 spreads the underfill layer 130, at least some of the spacer elements 134 are sandwiched between the active side 112 of the dies 110 and the first side 162 of the support member 160. These spacer elements 134 inhibit further movement of the dies 110 in the direction T to space the dies 110 apart from the support member 160 by a gap $G_1$, which is generally equal to the diameter $D_3$ of the spacer elements 134. In other embodiments, however, the electrical couplers 120 may not completely collapse during reflow and the gap $G_1$ may be greater than the diameter $D_3$ of the spacer elements 134. After reflowing the electrical couplers 120, a casing 170 can be formed over the dies 110, a plurality of electrical members 180 (e.g., solder balls) can be attached to corresponding pads 168, and the assembly 102 can be cut along lines B-B to singulate a plurality of individual microelectronic devices 104.

One feature of the microelectronic devices 104 illustrated in FIG. 2C is that the spacer elements 134 space the dies 110 apart from the support member 160 by a predetermined distance selected to prevent the weight of the dies 110 from completely collapsing the electrical couplers 120 during reflow. An advantage of this feature is that the microelectronic devices 104 have a uniform and accurate height because the gap $G_1$ between the dies 110 and the substrate 160 is based on the diameter $D_3$ of the spacer elements 134. Another advantage of this feature is that the spacer elements 134 are expected to eliminate or at least inhibit the electrical shorting which can occur when the electrical couplers 120 collapse and spread during reflow.

C. Additional Embodiments of Methods for Manufacturing Microelectronic Devices

Figure 3A:
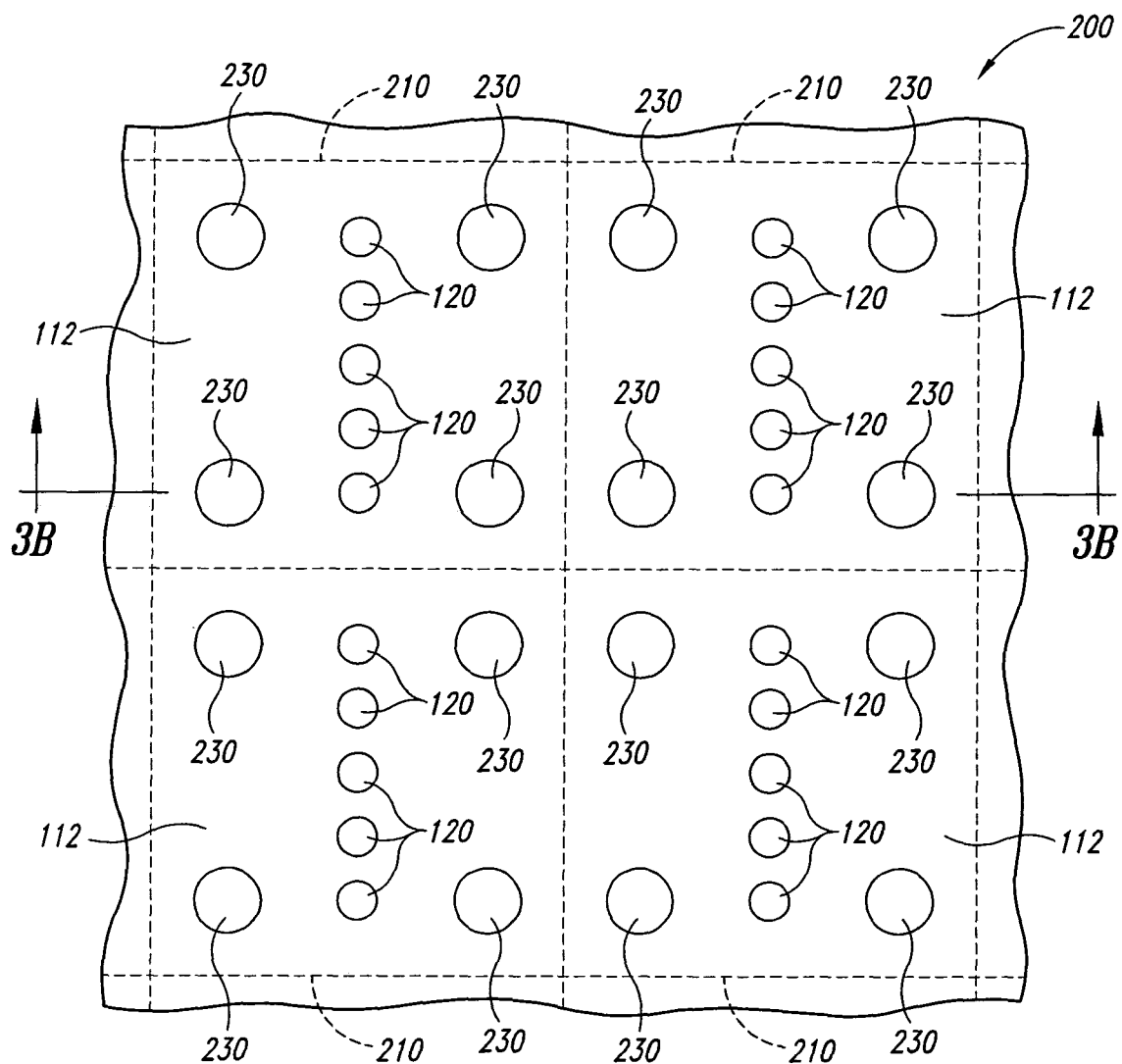

FIGS. 3A-3E illustrate stages in another embodiment of a method for manufacturing a plurality of microelectronic devices in accordance with the invention. For example, FIG. 3A is a top plan view of a microfeature workpiece 200, and FIG. 3B is a schematic side cross-sectional view of the workpiece 200 taken substantially along line 3B-3B in FIG. 3A. Referring to both FIGS. 3A and 3B, the illustrated workpiece 200 is generally similar to the workpiece 100 described above with reference to FIG. 2A. For example, the workpiece 200 includes a substrate 108 (FIG. 3B), a plurality of dies 210 formed in and/or on the substrate 108, and a plurality of electrical couplers 120 attached to corresponding terminals 116 (FIG. 3B) on the dies 210. The illustrated workpiece 200, however, includes a plurality of discrete volumes of flowable material 230 arranged in an array on corresponding dies 210. The individual volumes of flowable material 230 include a binder 132 (FIG. 3B) and a plurality of spacer elements 134 (FIG. 3B) disposed within the binder 132. The spacer elements 134 are sized to provide a minimum gap between the dies 210 and the external members to which the dies 210 are subsequently attached. In the illustrated embodiment, the volumes of flowable material 230 are placed on the active side 112 at each corner of the individual dies 210. In other embodiments, such as the embodiment described below with reference to FIGS. 4A and 4B, the volumes of flowable material 230 can be arranged on the workpiece 200 in other configurations.

FIG. 3C is a schematic side cross-sectional view of the workpiece 200 after forming an underfill layer 238 on the active side 112 of the dies 210. The underfill layer 238 protects the dies 210 from moisture, chemicals, or other contaminants and may partially or completely cover the electrical couplers 120 and/or the volumes of flowable material 230. In other embodiments, the underfill layer 238 may not be deposited onto the workpiece 200, but rather underfill material may be introduced into the gap between the dies 210 and a support member after attaching the dies 210 to the support member. In additional embodiments, the dies 210 may not include an underfill layer. In either case, the workpiece 200 can be cut along lines C-C to singulate the individual microelectronic dies 210.

FIG. 3D is a schematic side cross-sectional view of a microelectronic device assembly 202 including the singulated microelectronic dies 210 arranged in an array on a support member 260. The illustrated support member 260 can be generally similar to the support member 160 described above with reference to FIG. 2B. For example, the support member 260 includes a plurality of contacts 164, a plurality of pads 168, and a plurality of traces 169 electrically coupling the contacts 164 to corresponding pads 168. The individual dies 210 are placed on the support member 260 by pressing the volumes of flowable material 230 and the underfill layer 238 against the first side 162 of the support member 260 with the electrical couplers 120 aligned with corresponding contacts 164.

FIG. 3E is a schematic side cross-sectional view of the microelectronic device assembly 202 after reflowing the electrical couplers 120 to mechanically and electrically connect the terminals 116 to the contacts 164. During reflow, the weight of the dies 210 may cause the heated electrical couplers 120 to collapse such that the dies 210 move toward the support member 260 in the direction T. The movement of the dies 210 spreads the volumes of flowable material 230, and at least some of the spacer elements 134 are sandwiched between the active side 112 of the dies 210 and the first side 162 of the support member 260. These spacer elements 134 inhibit further movement of the dies 210 in the direction T and space the dies 210 apart from the support member 260 by a gap $G_1$. After reflowing the electrical couplers 120, a casing 170 is formed over the dies 210, a plurality of conductive members 180 are attached to corresponding pads 168, and the assembly 202 can be cut along lines D-D to singulate a plurality of individual microelectronic devices 204.

D. Additional Embodiments of Microfeature Workpieces With Flowable Material

Figure 4A:
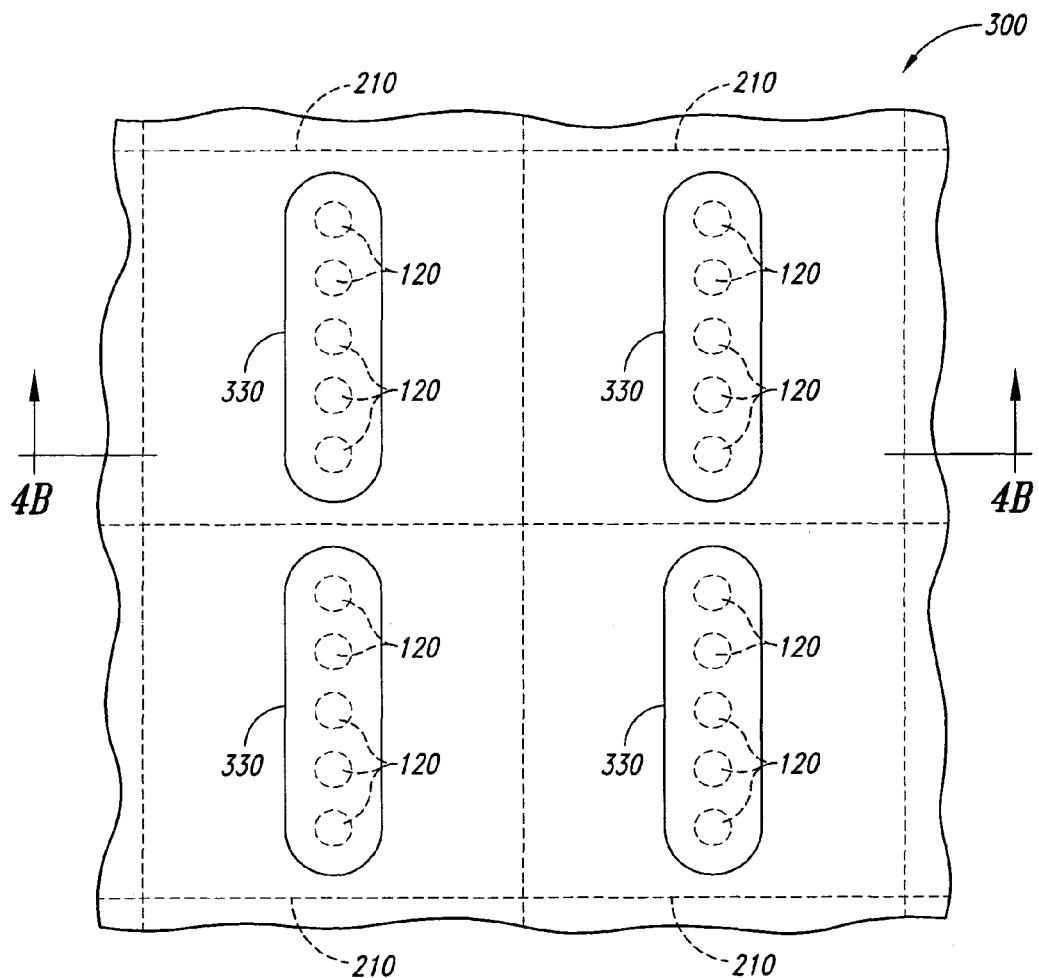
FIG. 4A is a schematic top plan view of a microfeature workpiece in accordance with another embodiment of the invention.
Figure 4B:
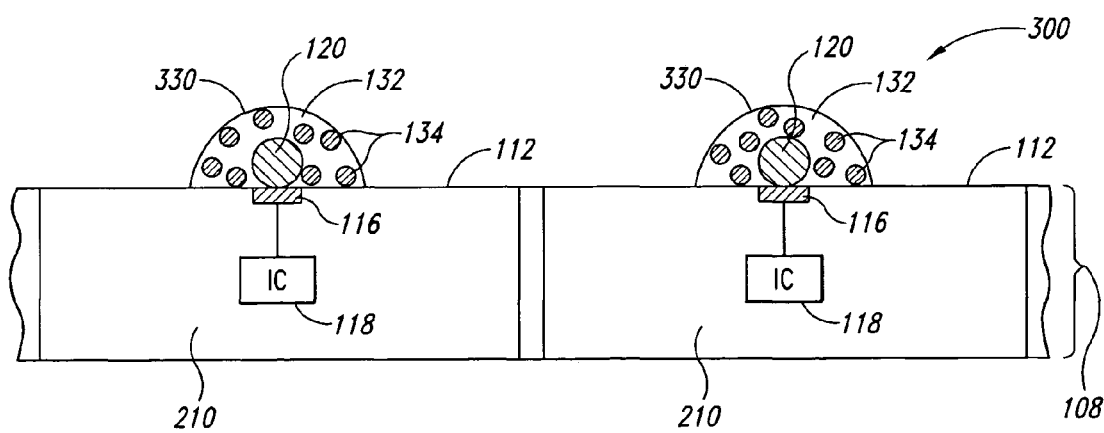
FIG. 4B is a schematic side cross-sectional view of the workpiece taken substantially along line 4B-4B in FIG. 4A.

FIG. 4A is a schematic top plan view of a microfeature workpiece 300 in accordance with another embodiment of the invention. FIG. 48 is a schematic side cross-sectional view of the workpiece 300 taken substantially along line 4B-4B in FIG. 4A. The illustrated workpiece 300 is generally similar to the workpiece 200 described above with reference to FIGS. 3A and 3B. For example, the workpiece 300 includes a substrate 108 (FIG. 4B), a plurality of dies 210 formed in and/or on the substrate 108, and a plurality of electrical couplers 120 attached to corresponding terminals 116 (FIG. 4B) on the dies 210. The illustrated workpiece 300, however, includes a plurality of discrete volumes of flowable material 330 arranged in strips generally corresponding to the line of terminals 116 and electrical couplers 120 on each die 210. The volumes of flowable material 330 include a binder 132 (FIG. 4B) and a plurality of spacer elements 134 (FIG. 4B) disposed within the binder 132. The spacer elements 134 are sized to provide a minimum gap between the dies 210 and the external members to which the dies 210 are subsequently attached. Although in the illustrated embodiment the volumes of flowable material 330 cover the electrical couplers 120, in other embodiments the volumes of flowable material 330 may not completely cover the electrical couplers 120.

E. Additional Embodiments of Microelectronic Devices Including Stacked Dies

Figure 5A:
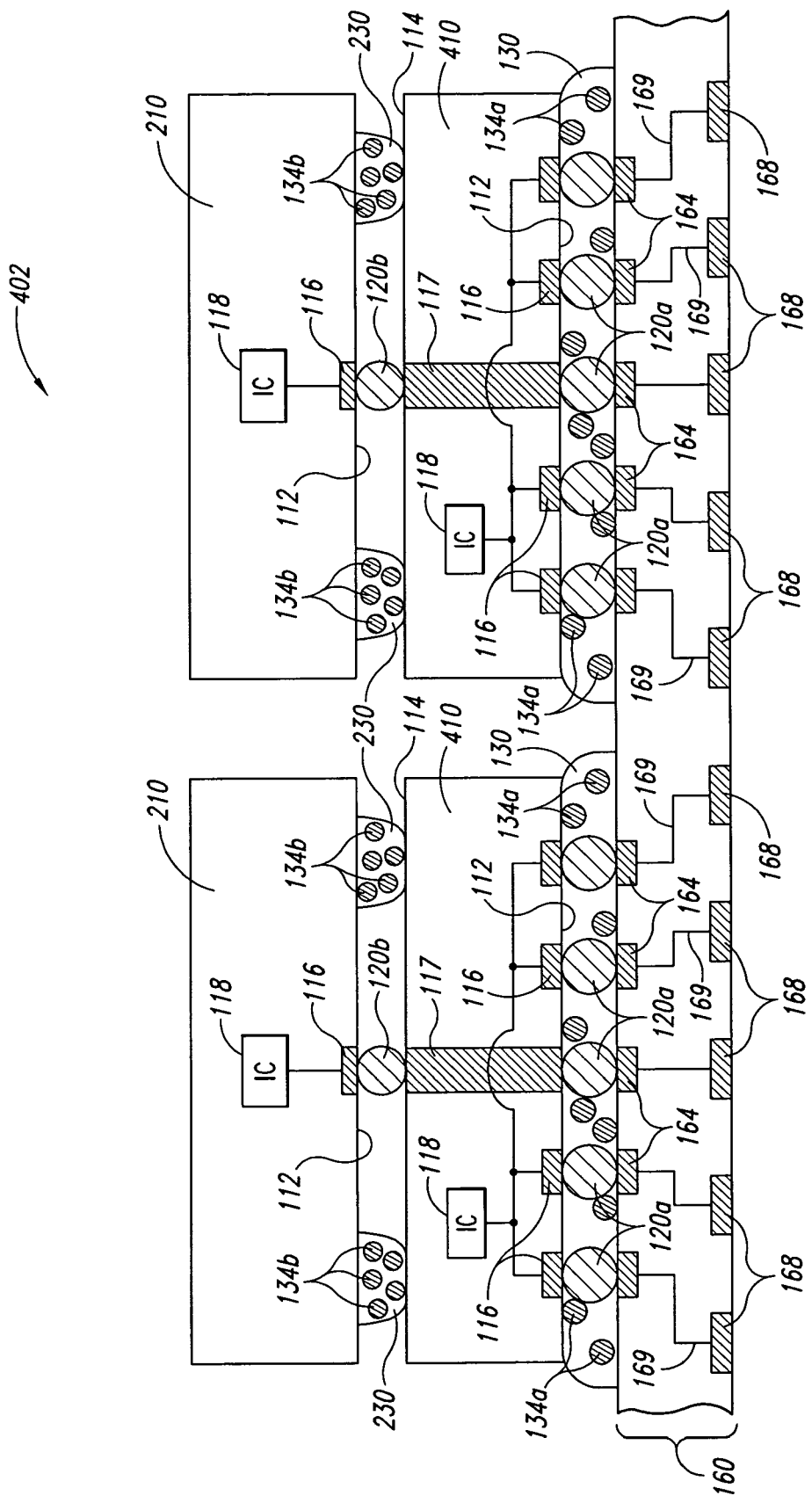
FIGS. 5A and 5B illustrate stages in another embodiment of a method for manufacturing a plurality of microelectronic devices in accordance with the invention.

FIG. 5A is a schematic side cross-sectional view of a microelectronic device assembly 402 in accordance with another embodiment of the invention. The device assembly 402 is generally similar to the assembly 102 described above with reference to FIG. 2B. For example, the illustrated assembly 402 includes a support member 160, a plurality of first dies 410 carried by the support member 160, a plurality of first electrical couplers 120a extending between the terminals 116 of the first dies 410 and corresponding contacts 164 on the support member 160, and a flowable material or underfill layer 130 disposed between the first dies 410 and the support member 160. In the illustrated embodiment, however, the individual first dies 410 further include a plurality of conductive through-wafer interconnects 117 extending between the active side 112 and the backside 114.

The illustrated microelectronic device assembly 402 further includes a plurality of second dies 210 attached to the backside 114 of corresponding first dies 410, a plurality of second electrical couplers 120b attached between the terminals 116 of the second dies 210 and corresponding interconnects 117 in the first dies 410, and a plurality of discrete volumes of flowable material 230 disposed between the first and second dies 410 and 210. The volumes of flowable material 230 can be formed on the active side 112 of the second dies 210 or the backside 114 of the first dies 410 before the second dies 210 are attached to the first dies 410. In either case, the underfill layer 130 and the volumes of flowable material 230 include a plurality of spacer elements 134a-b, respectively, for providing a minimum gap between the different components. In other embodiments, the assembly 402 can further include an underfill layer between the first and second dies 410 and 210.

Figure 5B:
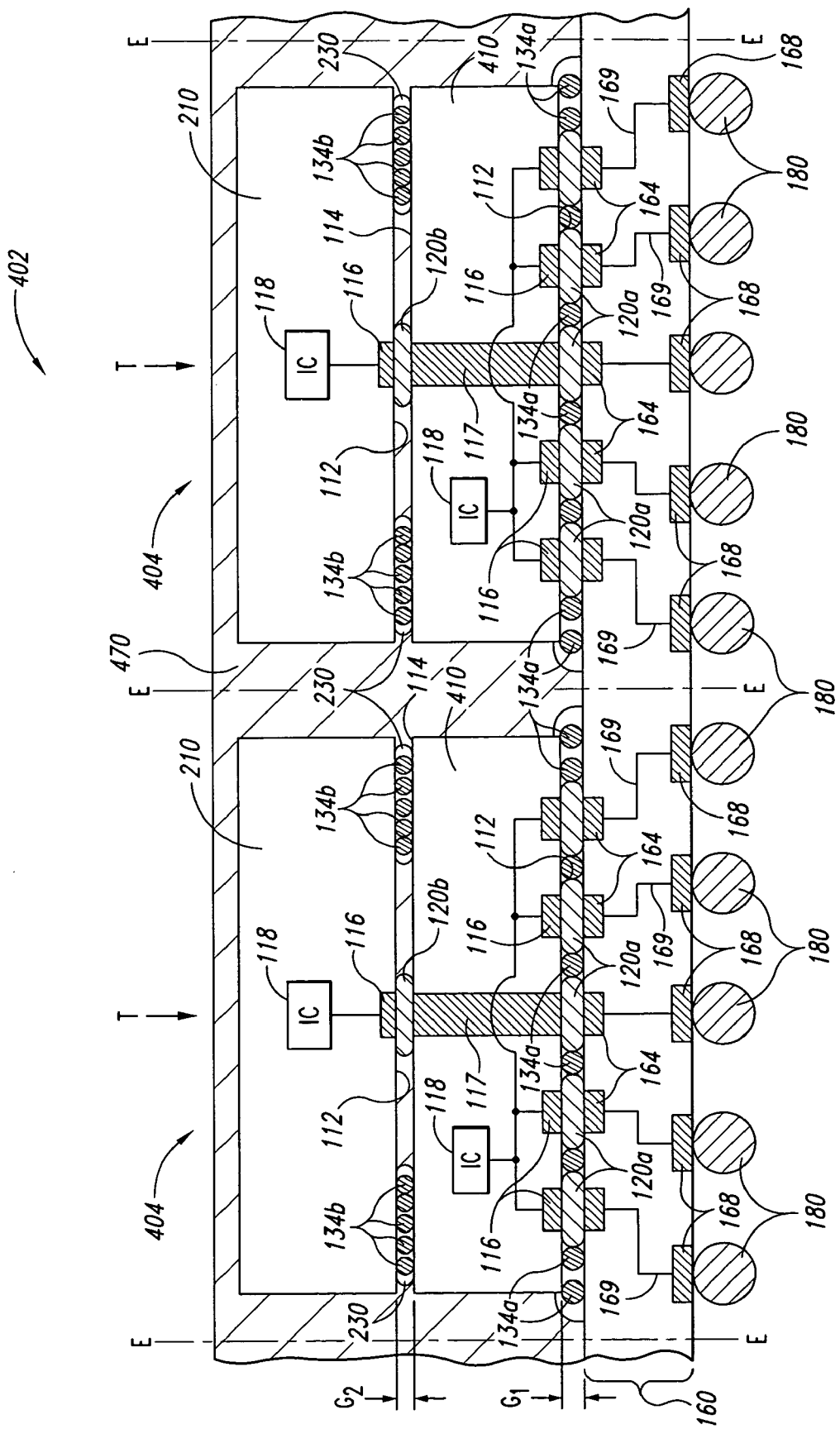

FIG. 5B is a schematic side cross-sectional view of the microelectronic device assembly 402 after reflowing the first and second electrical couplers 120a-b. During reflow, the weight of the first and second dies 410 and 210 causes the first and second electrical couplers 120a-b to collapse such that the first and second dies 410 and 210 move toward the support member 160 in the direction T. The movement of the first dies 410 spreads the underfill layer 130, and at least some of the spacer elements 134a are sandwiched between the active side 112 of the first dies 410 and the first side 162 of the support member 160. These spacer elements 134a inhibit further movement of the first dies 410 in the direction T and space the first dies 410 apart from the support member 160 by a gap $G_1$. The movement of the second dies 210 spreads the volumes of flowable material 230, and at least some of the spacer elements 134b are sandwiched between the active side 112 of the second dies 210 and the backside 114 of the first dies 410. These spacer elements 134b inhibit further movement of the second dies 210 in the direction T and space the first and second dies 410 and 210 apart by a gap $G_2$. After reflowing the first and second electrical couplers 120a-b, a casing 470 is formed over the dies 210 and 410, a plurality of conductive members 180 are attached to corresponding pads 168, and the assembly 402 can be cut along lines E-E to singulate a plurality of individual microelectronic devices 404.

One feature of the microelectronic devices 404 illustrated in FIG. 5B is that the spacer elements 134b are positioned outboard the second electrical couplers 120b. One advantage of this feature is that the spacer elements 134b prevent die tilt in which the distance between the first and second dies 410 and 210 varies across the devices 404. Die tilt can cause problems with molding, testing, and other post-reflow processes. For example, if the second die 210 is not parallel with the first die 410, the "high side" of the second die 210 may be exposed after forming the casing 470.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

I claim:

1. A microelectronic device at an intermediate stage of processing, comprising:
   a microelectronic die having an integrated circuit and a plurality of terminals operably coupled to the integrated circuit;
   a plurality of metal connectors deposited on corresponding terminals, wherein the metal connectors have a first dimension before being reflowed such that the metal connectors project from the die by a first distance before the metal connectors are reflowed; and
   a flowable material disposed on the die and about the metal connectors, the flowable material includes a binder and a plurality of spacer elements distributed generally uniformly throughout the binder, the plurality of spacer elements having a second dimension less than the first dimension of the metal connectors before the metal connectors are reflowed such that after the metal connectors are reflowed the spacer elements are configured to space the die apart from a support member by a second distance corresponding to the second dimension of the spacer elements.

2. The microelectronic device of claim 1 wherein:
   the metal connectors comprise a plurality of solder balls having a first diameter;
   the spacer elements comprise a plurality of dielectric spherical members having a second diameter of about 40% to about 70% of the first diameter of the metal connectors;
   the spherical members are distributed generally uniformly throughout the flowable material; and
   the flowable material further comprises at least one of an underfill material or a flux compound.

3. The microelectronic device of claim 1 wherein the second dimension of individual spacer elements is about 40% to about 70% of the first dimension of the metal connectors.

4. The microelectronic device of claim 1 wherein the spacer elements comprise a plurality of dielectric members.

5. The microelectronic device of claim 1 wherein the individual spacer elements have a dimension greater than 37 microns.

6. The microelectronic device of claim 1 wherein the flowable material is disposed in discrete volumes arranged in an array on the die.

7. The microelectronic device of claim 1 wherein the metal connectors comprise a plurality of solder balls electrically coupled to corresponding terminals.

8. A microelectronic device at an intermediate stage of processing, comprising:
   a microelectronic die having an integrated circuit and a plurality of terminals operably coupled to the integrated circuit;
   a plurality of metal connectors deposited on corresponding terminals, wherein the metal connectors have a first dimension before being reflowed such that the metal connectors project from the die by a first distance before the metal connectors are reflowed; and
   a flowable material disposed on the die and about the metal connectors, wherein the flowable material includes a plurality of glass spheres having a second dimension less than the first dimension of the metal connectors before the metal connectors are reflowed such that after the metal connectors are reflowed the glass spheres are configured to space the die apart from a support member by a second distance corresponding to the second dimension of the glass spheres.

9. A microelectronic device at an intermediate stage of processing, comprising:
   a microelectronic die having an integrated circuit and a plurality of terminals operably coupled to the integrated circuit;
   a plurality of metal connectors deposited on corresponding terminals, wherein the metal connectors have a first dimension before being reflowed such that the metal connectors project from the die by a first distance before the metal connectors are reflowed; and
   a flowable material covering at least some of the terminals on the die and being disposed on the die and about the metal connectors, wherein the flowable material includes a plurality of spacer elements having a second dimension less than the first dimension of the metal connectors before the metal connectors are reflowed such that after the metal connectors are reflowed the spacer elements are configured to space the die apart from a support member by a second distance corresponding to the second dimension of the spacer elements.

10. A microelectronic device at an intermediate stage of processing, comprising:
    a microelectronic die having an integrated circuit and a plurality of terminals operably coupled to the integrated circuit;
    a plurality of metal connectors deposited on corresponding terminals, wherein the metal connectors have a first dimension before being reflowed such that the metal connectors project from the die by a first distance before the metal connectors are reflowed; and
    a flowable material disposed on the die and about the metal connectors, wherein the flowable material includes a no-flow underfill and a plurality of spacer elements having a second dimension less than the first dimension of the metal connectors before the metal connectors are reflowed such that after the metal connectors are reflowed the spacer elements are configured to space the die apart from a support member by a second distance corresponding to the second dimension of the spacer elements.

11. A microelectronic device at an intermediate stage of processing, comprising:
   a microelectronic die having an integrated circuit and a plurality of terminals operably coupled to the integrated circuit;
   a plurality of metal connectors deposited on corresponding terminals, wherein the metal connectors have a first dimension before being reflowed such that the metal connectors project from the die by a first distance before the metal connectors are reflowed; and
   a flowable material disposed on the die and about the metal connectors, wherein the flowable material includes a flux compound and a plurality of spacer elements having a second dimension less than the first dimension of the metal connectors before the metal connectors are reflowed such that after the metal connectors are reflowed the spacer elements are configured to space the die apart from a support member by a second distance corresponding to the second dimension of the spacer elements.

12. A microelectronic device at an intermediate stage of processing the microelectronic device, comprising:
   a microelectronic component having an active side and a plurality of terminals on the active side;
   a plurality of electrical couplers attached to corresponding terminals and projecting from the microelectronic component, the individual electrical couplers having a first dimension before bonding the electrical couplers to corresponding contacts of a support member; and
   a flowable material disposed on the active side of the microelectronic component before bonding the electrical couplers to the corresponding contacts of the support member, the flowable material including a no-flow underfill and a plurality of spacer elements having a second dimension less than the first dimension of the electrical couplers.

13. The microelectronic device of claim 12 wherein the individual spacer elements are sized to space the microelectronic component apart from the support member after attaching the microelectronic component to the support member.

14. The microelectronic device of claim 12 wherein the spacer elements comprise a plurality of dielectric members distributed generally uniformly throughout the flowable material.

15. A microfeature workpiece at an intermediate stage of processing the microfeature workpiece, comprising:
   a plurality of microelectronic dies;
   a plurality of electrical couplers arranged in discrete arrays that are electrically coupled to corresponding microelectronic dies, wherein individual electrical couplers have a first dimension before bonding the electrical couplers to corresponding contacts of a support member; and
   a flowable material disposed on the microelectronic dies before bonding the electrical couplers to the corresponding contacts of the support member, the flowable material including spacer elements being distributed generally uniformly throughout the flowable material and having a second dimension less than the first dimension of the electrical couplers.

16. The microfeature workpiece of claim 15 wherein the individual spacer elements have a second dimension of about 40% to about 70% of the first dimension of the electrical couplers.

17. The microfeature workpiece at an intermediate stage of processing the microfeature workpiece, comprising:
   a plurality of microelectronic dies;
   a plurality of electrical couplers arranged in discrete arrays that are electrically coupled to corresponding microelectronic dies, wherein individual electrical couplers have a first dimension before bonding the electrical couplers to corresponding contacts of a support member; and
   a flowable material disposed on the microelectronic dies before bonding the electrical couplers to the corresponding contacts of the support member, the flowable material including a no-flow underfill and a plurality of spacer elements having a second dimension less than the first dimension of the electrical couplers.

18. The microfeature workpiece of claim 17 wherein:
   the individual microelectronic dies comprise a plurality of terminals on which corresponding electrical couplers are deposited; and
   the flowable material is disposed in discrete volumes covering at least some of the terminals on corresponding dies.

19. The microfeature workpiece of claim 17 wherein the flowable material is disposed in a layer covering multiple dies.

20. The microfeature workpiece of claim 15 wherein the flowable material is disposed in discrete volumes arranged in arrays on corresponding microelectronic dies.

* * * * *